US007071791B1

(12) United States Patent
Wilson, III

(10) Patent No.: US 7,071,791 B1
(45) Date of Patent: Jul. 4, 2006

(54) AUTOMATIC ANTENNA-SWITCHING APPARATUS AND SYSTEM

(75) Inventor: Robert E. Wilson, III, Forked River, NJ (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 497 days.

(21) Appl. No.: 10/361,035

(22) Filed: Jan. 30, 2003

(51) Int. Cl.
*H03G 11/04* (2006.01)

(52) U.S. Cl. .................................................... 333/17.1

(58) Field of Classification Search ............... 333/17.1; 343/876; 455/269, 272–275, 277.1, 277.2, 455/279.1

See application file for complete search history.

(56) References Cited

U.S. PATENT DOCUMENTS 3,548,263 A * 12/1970 McArthur ................... 361/153
4,433,344 A * 2/1984 Gradin et al. ............... 348/706
4,499,606 A * 2/1985 Rambo ..................... 455/277.2
4,977,616 A * 12/1990 Linder et al. ............ 455/277.2
5,239,541 A * 8/1993 Murai ........................ 370/345
5,303,396 A * 4/1994 Ooyagi et al. .............. 455/134
6,052,585 A * 4/2000 Homma .................. 455/426.1
6,903,656 B1 * 6/2005 Lee ......................... 340/572.1

* cited by examiner

*Primary Examiner*—Robert Pascal
*Assistant Examiner*—Kimberly E Glenn
(74) *Attorney, Agent, or Firm*—Michael Zelenka; George B. Tereschuk

(57) ABSTRACT

An automatic antenna-switching apparatus is provided for the user to connect a single multiband communications platform to a group of antennas with different frequencies by detecting the RF energy input representing the user's selected frequency and automatically switching to the properly polarized and matched antenna for the intended radio band in the group of antennas. The automatic antenna-switching apparatus includes an RF input port, a means for RF sensing, a means for antenna port selection, a group of RF output connectors and a group of different output antennas. The RF sensing means senses the RF energy with a means for frequency counting that determines the exact frequency represented by the RF energy during a particular radio transmission. The RF sensing means sends a frequency count output to the antenna port selection means that compares the frequency count output with the available connected output antennas. The present invention also contemplates an automatic antenna-switching system and a method for automatically switching antennas for a multiband communications device to different frequencies.

28 Claims, 2 Drawing Sheets

AUTOMATIC ANTENNA-SWITCHING APPARATUS AND SYSTEM

GOVERNMENT INTEREST

The invention described herein may be manufactured, used, imported, sold, and licensed by or for the Government of the United States of America without the payment to me of any royalty thereon.

FIELD OF THE INVENTION

This invention relates in general to the field of antennas. In particular, this invention relates to an automatic antenna-switching apparatus that allows the user to connect a single multiband communications platform to several antennas and automatically switch between antennas based on the selected frequency without additional user actions.

BACKGROUND OF THE INVENTION

There are numerous situations where maintaining continuous tactical military communications is a mission critical requirement. Interruptions in communications can cause confusion, tactical disadvantages and a potential loss of life. Achieving continuous communications capability in the military is made more difficult by the fact that our armed forces often use numerous different types of communications platforms employing different and distinct frequencies and antennas, such as the AN/PSC-5, EPLRS, SATCOM radios and future Joint Tactical Radio System ("JTRS") terminals.

The difficulties caused by a multiplicity of frequencies and communications devices are exacerbated by the additional complexities caused by operating such different communications devices at a single location or in confined areas. Furthermore, the large number of different communications devices, each with its own unique operating frequency and energy polarization schemes have also spawned a corresponding number of unique antenna systems designed for each specific military radio. Similar situations may also occur in commercial environments such as shipping, transportation and finance where continuous communications are needed amidst multiple communications systems. Multiband communications could become more reliable with a simplified system that permits the user to use a single multiband communications platform with a group of different antennas organized with an autonomous antenna switching apparatus into a single and simplified communications system.

Current military use of the 225–400 MHz spectrum provides a cogent example of the long-felt need for such a simplified system. Most military users of the 225–400 MHz band have adopted vertically polarized energy by convention. However, a small portion of the 225–400 MHz band dedicated to satellite communications requires circular, not vertical, polarization. Adopting the unique conventions for SATCOM signal polarization allows for less interference between satellite and terrestrial VHF communications systems. Prior art passive RF selection devices are unable to determine the precise boundaries of the satellite sub-band and are therefore incapable of selecting the proper antenna.

Thus there has been a long-felt need for communications equipment that permits users to connect a single multiband communications platform to several different antennas and automatically switch between the antennas without suffering from the dangers, disadvantages, shortcomings and limitations of complex and costly equipment and interrupted communications from prior art passive RF selection arrangements. Prior art passive radio frequency selectors are considered deficient because their unintended emissions are losses that can also generate increased RFI/EMI concerns on platforms fitted with multiple antennas.

In order to satisfy this long-felt need for connecting a multiband communications platform to multiple antennas, the present invention provides an automatic antenna-switching apparatus which allows the military and commercial user to connect a single multiband communications platform to a group of antennas with different frequencies by detecting the actual RF energy input and automatically switching to the desired antenna in the group of antennas, without suffering from the problems, shortcomings, disadvantages and limitations of prior art passive selection devices. The present invention provides an automatic antenna-switching apparatus that detects an RF energy input representing the user's selected frequency and makes a logical decision through embedded software to select the properly polarized and matched antenna for the intended radio band. In accordance with the present invention, the automatic antenna-switching apparatus could be provided with either fixed output antenna port selections, or re-programmable selection points to adapt to additional or future bandwidth and antenna requirements. The types of military radios where this apparatus could be used include: the AN/PSC-5, AN/PRC-117, AN/PRC-113, URC-200 and the JTRS system. In commercial communications, the automatic antenna-switching apparatus could be employed in communications centers and in developing mobile communications centers designed to bridge communications systems between military, public service and Homeland Defense missions or applications. This invention's automatic antenna-switching device permits the commercial and military user to employ multiple communications platforms, automatically and autonomously switch from one antenna to another and maintain communications without suffering from the problems, shortcomings, disadvantages and limitations of interrupted service through changes in radio transceivers, or manual selection of antenna systems.

SUMMARY OF THE INVENTION

It is an object of the present invention to provide an antenna-switching apparatus for switching between multiple antennas.

It is another object of the present invention to provide an automatic antenna-switching apparatus for a multiband communications platform to automatically switch between multiple antennas.

It is a further object of the present invention to provide an automatic antenna-switching system for a multiband communications platform to automatically switch between multiple antennas based on detecting RF energy from a multiband radio system and selecting the appropriate antenna that matches the frequency and required polarization of the RF energy.

These and other objects can now be advantageously attained by an automatic antenna-switching apparatus comprising a multiband radio system, a single RF input port, a means for antenna-switching and a group of connected antennas. In accordance with the present invention, the user tunes the multiband radio system to the desired frequency, the automatic antenna-switching apparatus detects an RF signal input and then automatically selects an antenna optimized for the desired portion of the spectrum from the connected antennas based on the frequency represented by the RF signal input, e.g. VHF High Frequency from 108–224 MHz. The present invention also includes an automatic antenna-switching system and a method for automatically switching antennas for a multiband communications device to different frequencies.

DETAILED DESCRIPTION OF THE DRAWINGS

Figure 1:
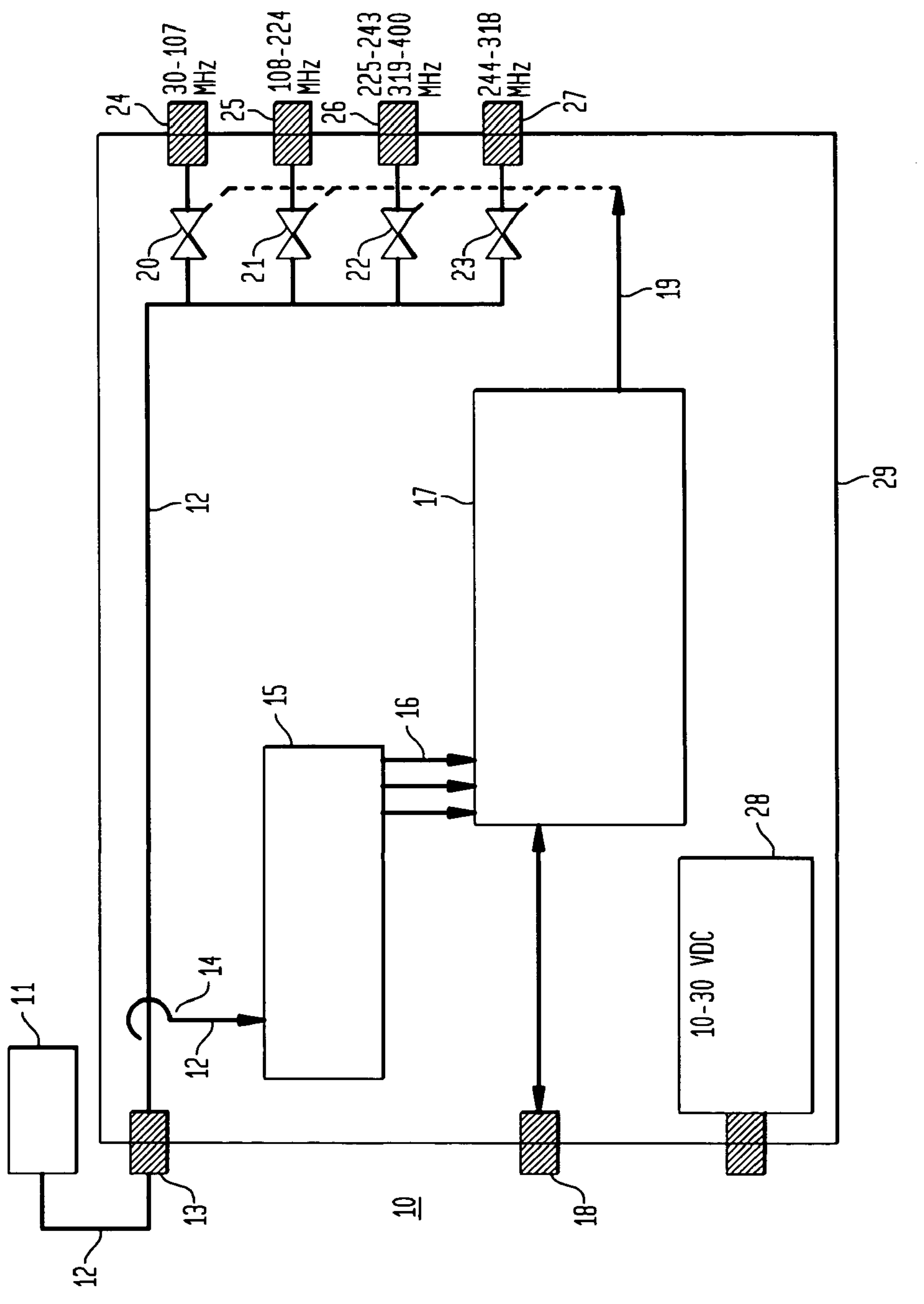
FIG. 1 is a conceptual flow diagram of the automatic antenna-switching apparatus of the present invention.

Referring now to FIG. 1, which is a conceptual flow diagram of the automatic antenna-switching apparatus of the present invention, the automatic antenna-switching apparatus 10 comprises an RF input port 13, a means for RF sensing 15, a means for antenna port selection 16 and a plurality of different output antennas 24–27. A multiband radio system capable of transmitting over a range of frequencies, which is represented by box 11, sends RF energy 12 to an RF input port 13. The RF energy 12 travels to a group of RF output connectors 20–23 and is sampled by an RF sensing coil 14. The RF energy 12 is sent to the RF sensing means 15, which senses the RF energy 12 with a means for frequency counting. The frequency counting means determines the exact frequency represented by the RF energy 12 during a particular radio transmission. The RF sensing means 15 sends a frequency count output 16 to the antenna port selection means 17. The antenna port selection means 17 further comprises software to compare the frequency count output 16 with the available connected output antennas 24–27. The antenna port selection means 17 can also include a port selection logic circuit. An external software logic programming port 18 permits the user to modify the software of the antenna selection means 17 when changing the output antennas 24–27. The antenna port selection means 17 provides an antenna selection output 19 to a selected one of the RF output connectors 20–23, which, in turn, switches on the corresponding output antenna 24–27. A conditioning power supply 28 provides electrical power for the internal circuits of the apparatus 10. The automatic antenna-switching apparatus 10 is enclosed in a metal container 29 in order to improve environmental operations, as well as minimize or eliminate unwanted radio frequency interference of passive RF energy multi-port couplers, through signal leakage to a non-selected antenna 24–27.

The automatic antenna-switching apparatus 10 will select the proper connected output antenna 24–27 based upon a user selected operating frequency on a transmission-by-transmission basis. The automatic antenna-switching apparatus 10 of the present invention functions autonomously, in that it operates automatically without user input or awareness of its operation. The power supply 28 further comprises a broad input, polarization insensitive direct current power supply, capable of receiving primary power from both military and civilian platforms. In the preferred embodiment, the automatic antenna-switching apparatus 10 is connected to a multiband radio system 11, however, the automatic antenna-switching apparatus 10 is versatile and the user can disconnect the multiband radio system 11 and connect a single frequency, trunked or spread spectrum communications service instead.

In operation, when the multiband radio system 11 is connected to the automatic antenna-switching apparatus 10, the user tunes the multiband radio system 11 to the desired operating frequency, e.g. VHF High Frequency from 108–224 MHz, and the multiband radio system 11 is momentarily keyed to send the RF energy 12 to the RF input port 13. This keying function could either be deliberate to activate the antenna-switching apparatus 10, or incidental with the initial attempted communications by the user. Additionally, the connected output antennas 24–27 could be configured for either the fixed portions of the frequency/polarization band or programmable for changes in the future with an external common serial connector, or an internal connector.

Figure 2:
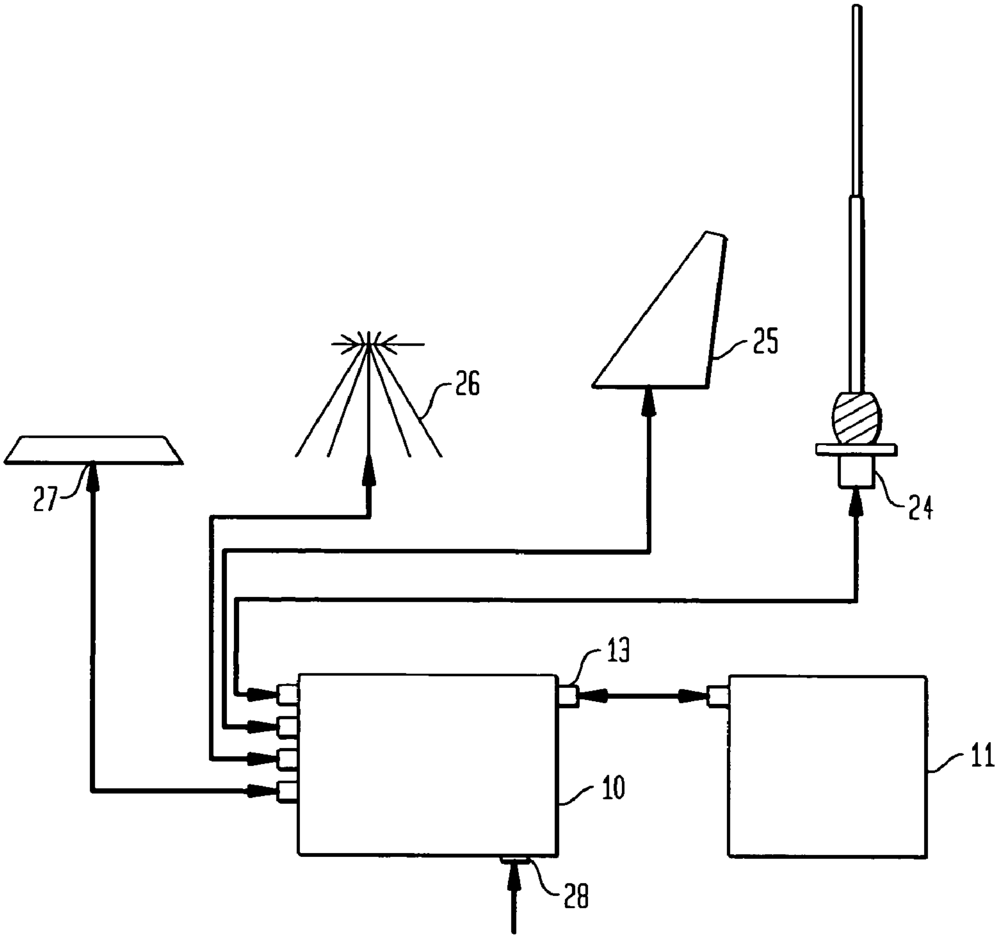
FIG. 2 is a conceptual diagram of one example of the automatic antenna-switching apparatus of the present invention connected to various military communications antennas.

FIG. 2 is a conceptual diagram of one example of the automatic antenna-switching apparatus 10 of the present invention, using the same numerals for like structures, connected to several military communications antennas 24–27. In this example, the connected output antennas 24–27 are a VHF Low Frequency antenna 24 for the 30–107 MHz frequency range, a VHF High Frequency antenna 25 for the 108–224 MHz frequency range, a UHF antenna 26 for the 225–243 frequency range and a SATCOM antenna 27 for the 244–318 MHz frequency range. Frequencies from 319 MHz to 399.995 MHz, would again be directed to the UHF vertical polarized antenna 26. In accordance with the present invention, the ability to precisely switch an antenna in the 225–400 MHz traditional military operating band between a vertically polarized antenna and a circularly polarized antenna, is a key advantage that the automatic antenna-switching apparatus 10 provides as a logical, active antenna selection device as compared to prior art passive splitter or combiner devices.

Numerous variations of the automatic antenna-switching apparatus 10 of the present invention are possible. For example, the automatic antenna-switching apparatus 10 can also support single frequency, trunked and spread spectrum communications services. The automatic antenna-switching apparatus 10 can be used in mobile communications platforms, fixed site communication stations, installed in any position or orientation and can also be sealed to be weather proof. The present invention also contemplates an automatic antenna-switching system comprising the multiband communications device 11, the antenna-switching apparatus 10 and a plurality of communications antennas 24–27.

Referring back to FIG. 1, the present invention also contemplates a method of automatically switching antennas for a communications device to different frequencies, comprising the steps of connecting an RF input port 13 to a communications device 11, receiving RF energy 12 from the communication device 11, the RF energy 12 having a given frequency, forming an RF sensing coil 14, connecting the RF input port 13 to the RF sensing coil 14 and a plurality of output antenna connectors 20–23 and connecting the plurality of output antenna connectors 20–23 to a plurality of output antennas 24–27, each output antenna having a plurality of antenna characteristics, forming a means for RF sensing 15 to include a means for frequency counting, forming a means for antenna port selection 17 to include a means for frequency comparison and placing the RF input port 13, the RF tuning coil 14, the RF sensing means 15, the antenna port selection means 17 and a plurality of output antenna connectors 20–23 into a metal housing 29. The method of the present invention also comprises the steps of providing the RF energy 12 from the RF sensing coil 14 to the means for RF sensing 15, sending a frequency count output 16 from the RF sensing means 15 to the means for antenna port selection 17, comparing the frequency count output 16 with the plurality of antenna characteristics to generate an antenna selection output 19, providing the antenna selection output 19 from the antenna port selection means 17 to a selected one of the plurality of RF output connectors 20–23, switching on one of the plurality of output antennas 24–27 that correspond to the selected RF output connector and transmitting the RF energy 12 on the corresponding one of the plurality of output antennas 24–27. In the preferred embodiment of the method of the present invention, the communications device 11 can be a multiband communications device.

The variations of the automatic antenna-switching apparatus can also apply to this invention's automatic antenna-switching system and the method of automatically switching antennas for a multiband communications device to different frequencies.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, arrangements and dimensions can achieve the results described herein, without departing from the spirit and scope of this invention. Accordingly, the present invention should not be limited by the foregoing description, but only by the appended claims.

I claim:

1. An automatic antenna-switching apparatus, comprising:

an RF input port receives RF energy from a communication device, said RF energy having a given frequency;

said RF input port is connected to an RF sensing coil and a plurality of output antenna connectors;

said RF sensing coil provides said RF energy to a means for RF sensing;

said RF sensing means, having a means for frequency counting, sends a frequency count output to a means for antenna port selection;

said plurality of output antenna connectors being coupled to a plurality of output antennas with a plurality of antenna characteristics;

said antenna port selection means, having a means for frequency comparison, compares said frequency count output with said plurality of antenna characteristics to generate an antenna selection output;

said antenna port selection means provides an antenna selection output to one of a plurality of RF output connectors causing a corresponding one of said plurality of antennas to transmit said RF energy;

said communications device is a multiband communications device;

said apparatus being connected to said multiband communications device and housed in a metal container; and said apparatus reduces an unwanted radio frequency interference by-product caused by signal leakage.

2. The automatic antenna-switching apparatus, as recited in claim 1, further comprising a direct current power supply.

3. The automatic antenna-switching apparatus, as recited in claim 2, further comprising said power supply being polarization insensitive.

4. The automatic antenna-switching apparatus, as recited in claim 3, further comprising said frequency comparison means being a computer software program.

5. The automatic antenna-switching apparatus, as recited in claim 4, further comprising said frequency comparison means having a port selection logic circuit.

6. The automatic antenna-switching apparatus, as recited in claim 5, further comprising said apparatus having an external software programming port to modify said computer software program.

7. The automatic antenna-switching apparatus, as recited in claim 1, further comprising said communications device being a single frequency radio.

8. The automatic antenna-switching apparatus, as recited in claim 7, further comprising said single frequency radio is installed on a mobile platform.

9. The automatic antenna-switching apparatus, as recited in claim 7, further comprising said single frequency radio is installed in a fixed-site communication station.

10. The automatic antenna-switching apparatus, as recited in claim 1, further comprising said communications device providing a spread spectrum communications service.

11. The automatic antenna-switching apparatus, as recited in claim 1, further comprising said communications device being a trunked radio.

12. An automatic antenna-switching system, comprising:

an RF input port connected to a multiband communications device receives RF energy from said multiband communication device, said RF energy having a given frequency;

said RF input port is connected to an RF sensing coil and a plurality of output antenna connectors, said plurality of output antenna connectors being coupled to a plurality of output antennas, each of said antennas having a plurality of antenna characteristics;

said RF sensing coil provides said RF energy to a means for RF sensing;

said RF sensing means, having a means for frequency counting, sends a frequency count output to a means for antenna port selection;

said antenna port selection means, having a means for frequency comparison, compares said frequency count output with said plurality of antenna characteristics to generate an antenna selection output;

said RF input port, said RF tuning coil, said RF sensing means, said antenna port selection means and said plurality of output antenna connectors being housed in a metal housing;

said antenna port selection means provides an antenna selection output selecting one of a plurality of RF output connectors, said one of the plurality of RF output connectors activating a corresponding one of said plurality of output antennas to transmit said RF energy; and said system reduces an unwanted radio frequency interference by-product caused by signal leakage.

13. The automatic antenna-switching system, as recited in claim 12, further comprising a direct current power supply.

14. The automatic antenna-switching system, as recited in claim 13, further comprising said power supply being polarization insensitive.

15. The automatic antenna-switching system, as recited in claim 14, further comprising said frequency comparison means being a computer software program.

16. The automatic antenna-switching system, as recited in claim 15, further comprising said frequency comparison means having a port selection logic circuit.

17. The automatic antenna-switching system, as recited in claim 16, further comprising said system having an external software programming port to modify said computer software program.

18. HA method of automatically switching antennas for a multiband communications device to different frequencies, comprising the steps of:

connecting an RF input port to said communications device;

receiving RF energy from said communications device, said RF energy having a given frequency;

forming an RF sensing coil;

connecting said RF input port to said RF sensing coil and a plurality of output antenna connectors;

connecting said plurality of output antenna connectors to a plurality of output antennas, each of said antennas having a plurality of antenna characteristics;

forming a means for RF sensing to include a means for frequency counting;

forming a means for antenna port selection to include a means for frequency comparison;

placing said RF input port, said RF sensing coil, said RF sensing means, said antenna port selection means and said plurality of output antenna connectors into a metal housing;

providing said RF energy from said RF sensing coil to said RF sensing means;

sending a frequency count output from said RF sensing means to said means for antenna port selection;

comparing said frequency count output with said plurality of antenna characteristics to generate an antenna selection output;

providing said antenna selection output from said antenna port selection means to a selected one of said plurality of RF output connectors;

switching on a corresponding one of said output antennas that corresponds to said selected RF output connector;

transmitting said RF energy to said corresponding one;

connecting a multiband communications device to connect to said RF input port; and reducing an unwanted radio frequency interference byproduct caused by signal leakage.

19. The method of automatically switching antennas for a multiband communications device to different frequencies, as recited in claim 18, further comprising the step of forming a direct current power supply.

20. The method of automatically switching antennas for a multiband communications device to different frequencies, as recited in claim 19, further comprising the step of forming said power supply to be polarization insensitive.

21. The method of automatically switching antennas for a multiband communications device to different frequencies, as recited in claim 20, wherein said frequency comparison means is a computer software program.

22. The method of automatically switching antennas for a multiband communications device to different frequencies, as recited in claim 21, further comprising the step of forming said frequency comparison means with a port selection logic circuit.

23. The method of automatically switching antennas for a multiband communications device to different frequencies, as recited in claim 22, further comprising the step of providing an external software programming port to modify said computer software program.

24. The method of automatically switching antennas for a multiband communications device to different frequencies, as recited in claim 18, wherein said communications device is a single frequency radio.

25. The method of automatically switching antennas for a multiband communications device to different frequencies, as recited in claim 24, further comprising the step of installing said single frequency radio on a mobile platform.

26. The method of automatically switching antennas for a multiband communications device to different frequencies, as recited in claim 25, further comprising the step of installing said single frequency radio in a fixed-site communication station.

27. The method of automatically switching antennas for a multiband communications device to different frequencies, as recited in claim 18, wherein said communications device provides a spread spectrum communications service.

28. The method of automatically switching antennas for a multiband communications device to different frequencies, as recited in claim 27, wherein said communications device is a trunked radio.

* * * * *